United States Patent [19]

Murakami

[11] Patent Number: 5,144,174
[45] Date of Patent: Sep. 1, 1992

[54] PROGRAMMABLE DELAY CIRCUIT HAVING A BUFFER STAGE CONNECTED IN CASCODE BETWEEN THE OUTPUTS OF A PLURALITY OF DIFFERENTIAL AMPLIFIERS AND THE OUTPUT TERMINAL

[75] Inventor: Daisuke Murakami, Kanagawa, Japan

[73] Assignee: Sony Corporation, Tokyo, Japan

[21] Appl. No.: 697,670

[22] Filed: May 9, 1991

[30] Foreign Application Priority Data

May 11, 1990 [JP] Japan .................................. 2-119792

[51] Int. Cl.[5] .................. H03K 5/159; H03K 3/01; G06G 7/12
[52] U.S. Cl. .................. 307/608; 307/595; 307/597; 307/494; 328/55
[58] Field of Search ............... 307/595, 597, 603, 605, 307/606, 608, 494; 328/55, 66

[56] References Cited

U.S. PATENT DOCUMENTS

| | | | |
|---|---|---|---|
| 4,641,048 | 2/1987 | Pollock | 307/608 |
| 4,797,586 | 1/1989 | Traa | 307/608 |

FOREIGN PATENT DOCUMENTS 0317758 5/1989 European Pat. Off. .

*Primary Examiner*—Stanley D. Miller
*Assistant Examiner*—Trong Phan

*Attorney, Agent, or Firm*—Hill, Van Santen, Steadman & Simpson

[57] ABSTRACT

A programmable delay circuit of the present invention is comprised of an input terminal to which an input signal to be delayed is supplied, N (N≧2) delay circuits of a plurality of stages connected in cascade, a plurality of differential amplifier transistors connected to respective stages between the delay circuits of the plurality of stages and having a pair of differential amplifier transistors and current switches for supplying a drive current from a common current source to the pair of differential amplifier transistors, a common output terminal commonly connected to respective outputs of a pair of differential amplifier transistors of the plurality of differential amplifiers and a control circuit for selectively controlling the current switches of the plurality of differential amplifiers, wherein even when any one of the current switches of the plurality of differential amplifiers is selected, delay amounts of the differential amplifiers become constant so that linearity of delay characteristic can be improved. Also, since the single common current source is employed, the power consumption can be reduced. When a buffer stage connected in cascode is provided between the outputs of the plurality of differential amplifiers and the common output terminal, the output capacitances of the differential amplifier transistors can be apparently reduced and thus the programmable delay circuit of the present invention can be operated at high speed.

5 Claims, 5 Drawing Sheets

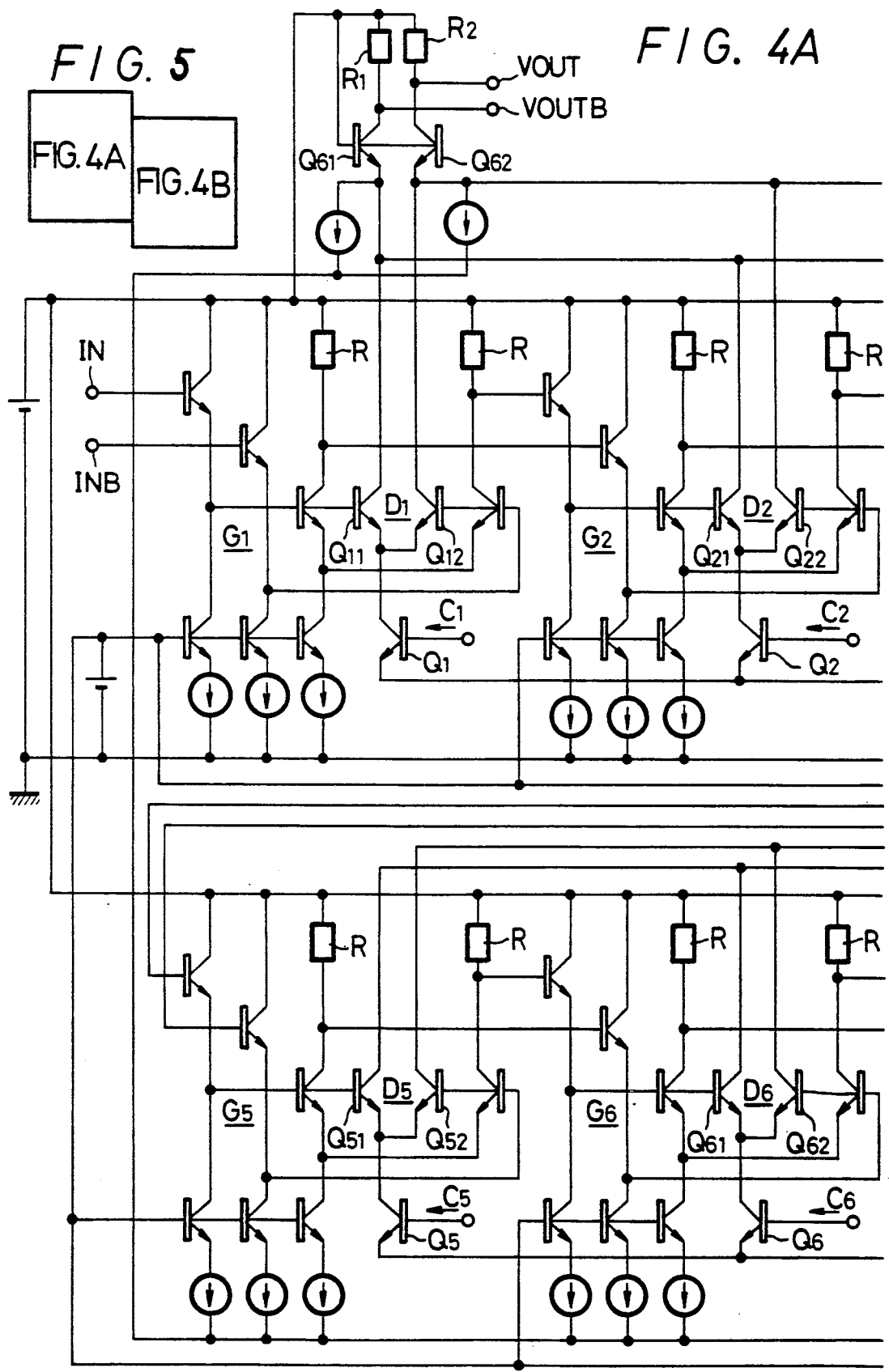

PROGRAMMABLE DELAY CIRCUIT HAVING A BUFFER STAGE CONNECTED IN CASCODE BETWEEN THE OUTPUTS OF A PLURALITY OF DIFFERENTIAL AMPLIFIERS AND THE OUTPUT TERMINAL

BACKGROUND OF THE INVENTION

1. Field of the Invention

The present invention generally relates to a programmable delay circuit and, more particularly, is directed to a programmable delay circuit in which linearity of delay characteristic is improved and power consumption is reduced and which is suitably applied to an IC (integrated circuit) tester or the like.

2. Description of the Prior Art

A Digitally Programmable Delay Chip with picosecond Resolution in IEEE Proceedings of the 1989 Bipolar Circuit and Technology Meetings Sep. 18–19, 1989, pp. 295 to 297 describes a conventional programmable delay circuit.

A block diagram forming FIG. 1 shows an example of such a conventional programmable delay circuit.

As shown in FIG. 1, a main or coarse delay circuit 1 is composed of 32 delay gates $G_0$ to $G_{31}$ connected in cascade, a multiplexer 1a and a latch circuit 1b. The latch circuit 1b latches a digital signal of 5 bits ($D_0$ to $D_4$) input thereto from a control circuit (not shown) and the multiplexer 1a is controlled in response to the digital output of the latch circuit 1b, thereby pulse signals applied to input terminals IN and INB being delayed by an arbitrary delay time of 110 picoseconds per gate. A cascade circuit 2 is connected to an output of the multiplexer 1a to expand the delay time and composed of a multiplexer 2a and a latch circuit 2b which latches a digital signal $D_5$. An output of the cascade circuit 2 is supplied through a buffer stage 3 to output terminals Q1 and Q1B, respectively, and a sub or fine tune circuitry 4 is connected to the output of the cascade circuit 2.

FIG. 2 is a schematic block diagram showing an example of a conventional multiplexer, and as shown in FIG. 2, the multiplexer 1a of FIG. 1 is generally comprised of 8 stages of delay gates $G_1$ to $G_8$ and seven multiplexers A through G which are supplied with control signals $S_0$ to $S_6$ delivered from the latch circuit 1b.

However, in the conventional delay circuit of FIG. 2, the multiplexer 1a is composed of seven multiplexers A through G connected in a so-called tournament fashion, which needs $2^n - 1$ multiplexers if there are provided $2^n$ delay circuits. Further, since the signal is passed through n multiplexers from each of the delay gates to the output terminal $Q_1$, the fixed delay time is increased. In that case, if n is increased, delay error caused by the multiplexer 1a from each of the delay gates to the output terminal $Q_1$ is increased, thus deteriorating linearity of delay characteristic more.

Furthermore, since the pulse signals supplied to the input terminals IN and INB are passed through the n multiplexers (e.g., the multiplexers A, E and G), the power consumption is increased.

SUMMARY OF THE INVENTION

Accordingly, it is an object of the present invention to provide an improved programmable delay circuit in which the aforenoted shortcomings and disadvantages encountered with the prior art can be eliminated.

More specifically, it is an object of the present invention to provide a programmable delay circuit in which linearity of delay characteristic can be improved.

It is another object of the present invention to provide a programmable delay circuit in which power consumption can be reduced.

It is still another object of the present invention to provide a programmable delay circuit which can be operated at high speed.

It is a further object of the present invention to provide a programmable delay circuit which can produce satisfactory delay characteristic.

According to a first aspect of the present invention, a programmable delay circuit is comprised of input terminals to which input signals to be delayed are supplied, N ($N \geq 2$) delay circuits of a plurality of stages connected in series, a plurality of differential amplifiers connected to respective stages of the plurality of stages of delay circuits and having a pair of differential amplifier transistors and a current switch for supplying a drive current from a common current source to the pair of differential amplifier transistors, a common output terminal commonly connected to respective output terminals of the pair of differential amplifier transistors of the plurality of differential amplifiers, and a control circuit for alternatively controlling the current switches of the plurality of differential amplifiers.

In accordance with a second aspect of the present invention, in a programmable delay circuit, a buffer stage connected in cascode is provided between outputs of the plurality of differential amplifiers and the common output terminal.

According to the programmable delay circuit of the present invention, even when any one of the current switches of the plurality of differential amplifiers is selected, delay amounts of the differential amplifiers become constant so that linearity of delay characteristic can be improved. Also, since the single common current source is employed, the power consumption can be reduced.

Further, when the buffer stages connected in cascode are provided between the outputs of said plurality of differential amplifiers and said common output terminal, the output capacitances of the differential amplifier transistors can be apparently reduced and thus the programmable delay circuit of the present invention can be operated at high speed.

The above, and other objects, features and advantages of the present invention will become apparent from the following detailed description of illustrative embodiments thereof to be taken in conjunction with the accompanying drawings.

BRIEF DESCRIPTION OF THE DRAWINGS

FIG. 4 (formed of FIGS. 4A and 4B) is a circuit diagram showing an embodiment of the programmable delay circuit according to the present invention; and FIG. 5 illustrates how FIGS. 4A and 4B are assembled.

DESCRIPTION OF THE PREFERRED EMBODIMENTS

The present invention will now be described with reference to the drawings.

Figure 1:
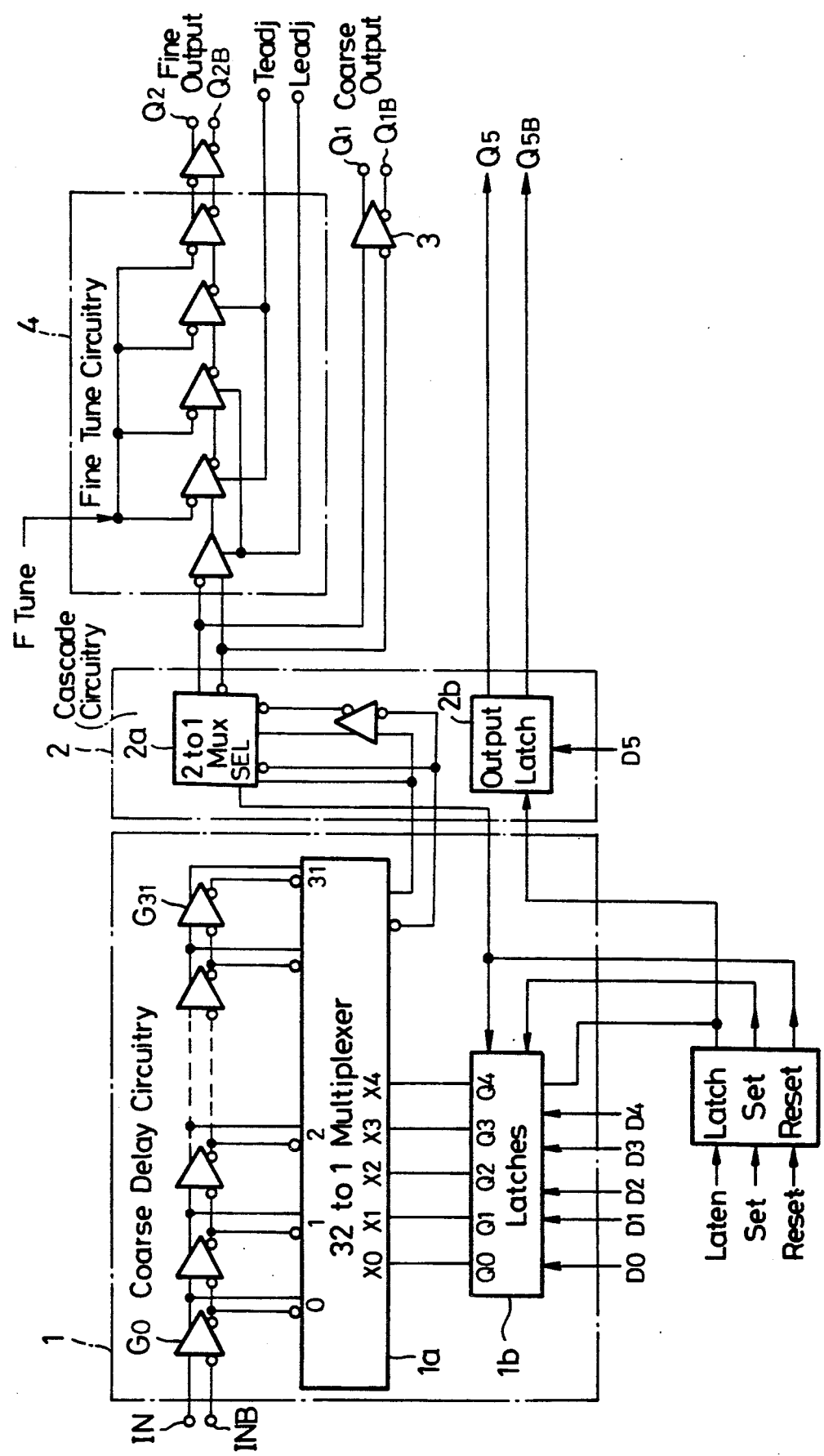
FIG. 1 is a block diagram showing an example of a conventional programmable delay circuit.
Figure 2:
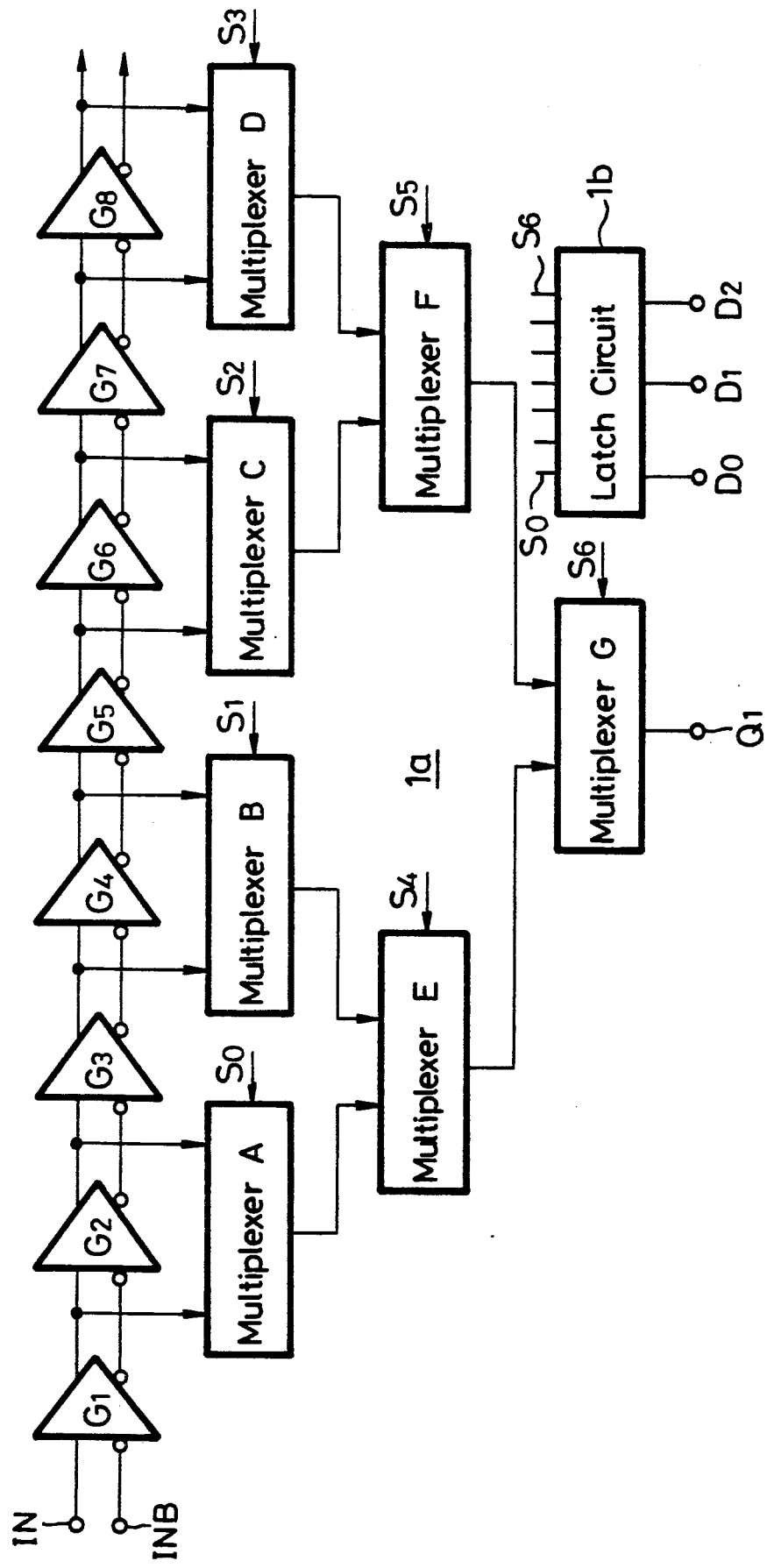
FIG. 2 is a block diagram showing an example of a multiplexer used in the conventional programmable delay circuit of FIG. 1.
Figure 3:
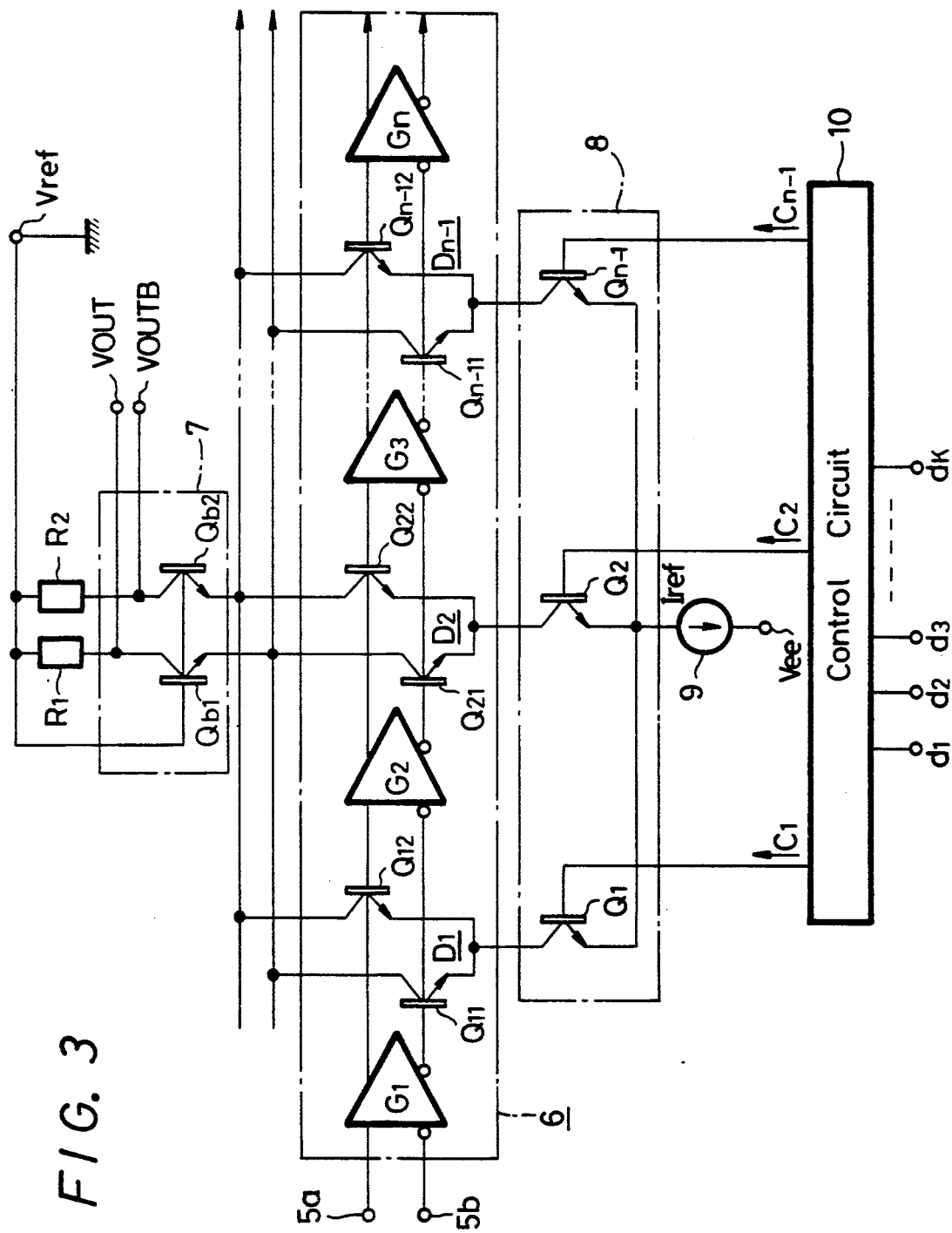
FIG. 3 is a block circuit diagram showing a fundamental arrangement of a programmable delay circuit of the present invention.

FIG. 3 shows in block circuit form a fundamental arrangement of the programmable delay circuit of the present invention. Referring to FIG. 3, input signals (pulse signals such as clock signals or the like) to be delayed are supplied to input terminals $5a$ and $5b$ of a delay circuit 6 and, by way of example, these input signals are opposite in phase. The delay circuit 6 has N stages ($N \geq 2$) and composed of a plurality of delay circuits ($G_1$ through $G_n$) which are connected in cascade. Input electrodes (bases) of a pair of differential amplifier transistors $Q_{11}$ and $Q_{12}$ are connected between the first and second delay circuits $G_1$ and $G_2$ of the delay circuit 6. Output electrodes (collectors) of the transistors $Q_{11}$ and $Q_{12}$ are connected through transistors $Q_{b1}$ and $Q_{b2}$ which constitute a buffer stage 7 and connected in cascode to common output terminals VOUT and VOUTB, respectively. As shown in FIG. 3, the transistors $Q_{b1}$ and $Q_{b2}$ are connected in cascode to the differential amplifier transistors. Incidentally, load resistors $R_1$ and $R_2$ are connected between a reference voltage source $V_{ref}$ (by way of example, ground potential) and the common output terminals VOUT and VOUTB, respectively. A current switch 8 is composed of transistors $Q_1$ to $Q_{n-1}$, and a common current source 9 has a current value of, for example, $I_{ref}$. The differential amplifier transistors $Q_{11}$ and $Q_{12}$ and the transistor $Q_1$ of the current switch 8 constitute a first differential amplifier $D_1$; differential amplifier transistors $Q_{21}$ and $Q_{22}$ connected between the second and third delay circuits $G_2$ and $G_3$ and a transistor $Q_2$ of the current switch 8 constitute a second differential amplifier $D_2$; and differential amplifier transistors $Q_{n-11}$ and $Q_{n-12}$ connected between the third delay circuit $G_3$ and an N'th delay circuit $G_n$ and a transistor $Q_{n-1}$ of the current switch 8 constitute a (N−1)th differential amplifier $D_{n-1}$. In FIG. 3, reference numeral 10 designates a control circuit which selectively controls the current switch 8. For example, the control circuit 10 controls the transistors $Q_1$ to $Q_{n-1}$ of the current switch 8 in response to, for example, digital signals $d_1$ to $d_k$ of K bits.

Operation of the thus constructed programmable delay circuit will be described below.

Referring to FIG. 3, when, for example, the transistor $Q_1$ of the current switch 8 is selected by the digital signals $d_1$ to $d_k$ of the control circuit 10, the transistor $Q_1$ is turned on to permit the current $I_{ref}$ of the common current source 9 to be supplied to the differential amplifier transistors $Q_{11}$ and $Q_{12}$ of the first differential amplifier $D_1$ so that the input signals applied to the input terminals $5a$ and $5b$ are supplied to the first delay circuit $G_1$. An output of the first delay circuit $G_1$ is amplified by the first differential amplifier $D_1$ and supplied through the buffer stage 7 to the common output terminals VOUT and VOUTB. Similarly, when the transistor $Q_2$ of the current switch 8 is selected, the transistor $Q_2$ is turned on to permit the current $I_{ref}$ of the common current source 9 to be supplied to the differential amplifier transistors $Q_{21}$ and $Q_{22}$ of the second differential amplifier $D_2$ so that the input signals applied to the input terminals $5a$ and $5b$ are supplied to the second delay circuit $G_2$. An output of the second delay circuit $G_2$ is amplified by the second differential amplifier $D_2$ and supplied through the buffer stage 7 to the common output terminals VOUT and VOUTB. That is, the current switch 8 of the plurality of differential amplifiers $D_1$ to $D_{n-1}$ is controlled by the control signals $C_1$ to $C_{n-1}$ of the control circuit 10, whereby the outputs of the (N−1)th delay circuits $G_1$ to $G_{n-1}$ can be selectively output. Even when any of the transistors Q to $Q_{n-1}$ of the current switch 8 of the plurality of differential amplifiers $D_1$ to $D_{n-1}$ is selected, the delay times of the differential amplifiers $D_1$ to $D_{n-1}$ are constant and the fixed delay times are reduced so that linearity of delay characteristic can be improved. Also, since the single common current source 9 is used, the power consumption can be reduced.

Further, when the cascode-connected buffer stage 7 is connected between the outputs of the plurality of differential amplifiers $D_1$ to $D_{n-1}$ and the common output terminals VOUT and VOUTB, the output capacitances of the differential amplifier transistors $Q_{11}$ to $Q_{n-12}$ are apparently reduced, thereby the programmable delay circuit of the invention being operated at high speed. Incidentally, the delay time can be further increased by providing other differential amplifiers (not shown) in the output of th Nth delay circuit $G_n$.

Alternatively, though not shown, it is possible to provide a differential amplifier which supplies the input signals applied to the input terminals $5a$ and $5b$ directly to the common output terminals VOUT and VOUTB (the first delay circuit $G_1$ is bypassed).

Figure 4B:
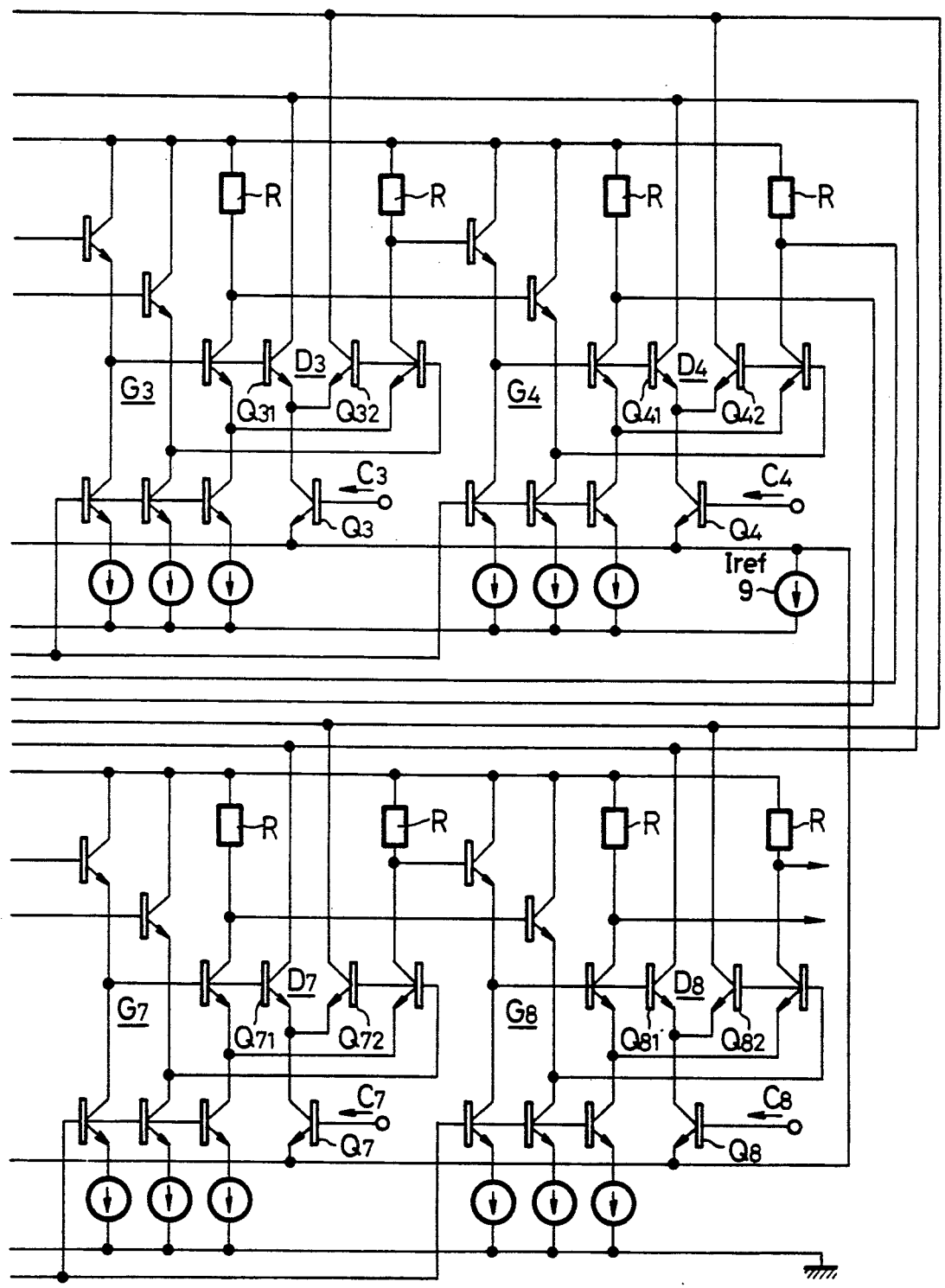

A specific circuit arrangement of the embodiment of the programmable delay circuit according to the present invention will be described with reference to FIG. 5. FIG. 5 is formed of FIGS. 4A and 4B drawn on two sheets of drawings so as to permit the use of a suitably large scale.

In FIG. 5, like parts corresponding to those of FIG. 3 are marked with the same references and therefore need not be described in detail.

As shown in FIG. 5, the delay circuit 6 of FIG. 3 is composed of eight stages of first delay circuit $G_1$ to eighth delay circuit $G_8$ and each of the first to eighth delay circuits $G_1$ to $G_8$ is formed of an emitter-follower Circuit and a differential amplifier. The transistors $Q_1$ to $Q_8$ constructing the current switch 8 of the first to eighth differential amplifiers $D_1$ to $D_8$ are controlled by control signals $C_1$ to $C_8$ from a control circuit (not shown). In the embodiment of FIG. 5, if the delay time of each delay circuit is selected to be, for example, 100 psec, the delay time can be varied in a range of from 100 psec to 800 psec (e.g., 10 nsec in the case of $2^n = 128$), thus achieving similar effects to those of FIG. 3.

Further, in this embodiment, since the input pulse signal is transmitted in a push-pull fashion, there is then the advantage that the duty ratio of the input pulse signal can be maintained constant until it is output.

As will be clear from the above explanation, according to the programmable delay circuit of the present invention, even when any one of the current switches of the plurality of differential amplifiers is selected, the delay amounts of the differential amplifiers become constant so that the linearity of the delay characteristic can be improved. Also, since the single common current source is employed, the power consumption can be reduced.

When the cascode-connected buffer stage is provided between the outputs of the plurality of differential amplifiers and the common output terminal, the output capacitances of the differential amplifier transistors can be apparently reduced so that the programmable delay circuit of the present invention can be operated at higher speed.

Furthermore, according to the programmable delay circuit of the present invention, even when the number of stages of the delay circuit is increased, delay errors of the multiplexer can be prevented from being accumulated unlike the example of the prior art, thus making it possible to obtain satisfactory delay characteristic.

Having described the preferred embodiments of the invention with reference to the accompanying drawings, it is to be understood that the invention is not limited to those precise embodiments and that various changes and modifications thereof could be effected by one skilled in the art without departing from the spirit or scope of the novel concepts of the invention as defined in the appended claims.

I claim as my invention:

1. A programmable delay circuit comprising:
   (a) an input terminal to which an input signal to be delayed is supplied;
   (b) N (N≧2) delay circuits of a plurality of stages connected in cascade;
   (c) a plurality of differential amplifiers respectively connected to respective stages between said plurality of stages of delay circuits and having a pair of differential amplifier transistors and current switches for supplying a drive current from a common current source to said pair of differential amplifier transistors;
   (d) an output terminal commonly coupled to respective output terminals of said pair of differential amplifier transistors of said plurality of differential amplifiers;
   (e) a buffer stage connected in cascode between said respective output terminals of aid plurality of differential amplifiers and said common output terminal; and
   (f) a digital control circuit for selecting only one of said current switches of said plurality of differential amplifiers.

2. A programmable delay circuit according to claim 1, wherein a buffer stage connected in cascode is provided between outputs of said plurality of differential amplifiers and said output terminal.

3. A programmable delay circuit according to claim 2, wherein the input signal to be delayed is directly supplied to said output terminal.

4. A programmable delay circuit according to claim 3, wherein an emitter-follower stage is connected between the input terminal to which the input signal to be delayed is supplied and the delay circuit of the first stage.

5. A programmable delay circuit according to claim 4, wherein a push-pull signal is supplied to said input terminal to which the input signal to be delayed is supplied and a push-pull signal delayed by a predetermined delay time is developed at said output terminal.

* * * * *